(12) United States Patent
Hsu

(10) Patent No.: US 9,709,599 B2
(45) Date of Patent: Jul. 18, 2017

(54) MEMBRANE PROBE CARD

(71) Applicant: Taiwan Semiconductor Manufacturing CO., LTD., Hsinchu (TW)

(72) Inventor: Ming-Cheng Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 71 days.

(21) Appl. No.: 14/151,208

(22) Filed: Jan. 9, 2014

(65) Prior Publication Data
US 2015/0192609 A1 Jul. 9, 2015

(51) Int. Cl.
| | |
|---|---|
| G01R 1/067 | (2006.01) |
| G01R 1/073 | (2006.01) |
| G01R 31/00 | (2006.01) |
| G01R 31/28 | (2006.01) |
| G01R 1/04 | (2006.01) |
| G01R 31/26 | (2014.01) |

(52) U.S. Cl.
CPC ........ *G01R 1/0416* (2013.01); *G01R 31/2601* (2013.01); *G01R 31/2886* (2013.01)

(58) Field of Classification Search
CPC .......... G01R 1/04; G01R 31/26–31/28; G01R 31/30–31/31; G01R 31/33; G01R 1/06738; G01R 1/06711; G01R 1/06794; G01R 1/07314; G01R 1/067; G01R 1/0675; G01R 1/073; G01R 31/00
USPC ..... 324/750, 754, 755, 762, 754.07, 754.03, 324/755.01, 756.03; 29/428, 825, 840, 29/852, 592
See application file for complete search history.

(56) References Cited

U.S. PATENT DOCUMENTS

| | | | | |
|---|---|---|---|---|
| 7,401,669 | B2 * | 7/2008 | Fujii | B60R 16/04 180/65.1 |
| 7,471,095 | B2 * | 12/2008 | Narita et al. | 324/756.05 |
| 7,616,018 | B2 * | 11/2009 | Lou et al. | 324/750.04 |
| 7,898,272 | B2 * | 3/2011 | Sasaki et al. | 324/756.03 |
| 7,956,627 | B2 * | 6/2011 | Kasukabe | G01R 1/07342 324/750.22 |
| 8,729,968 | B2 | 5/2014 | Hsieh et al. | |
| 2002/0043980 | A1 * | 4/2002 | Rincon | G01R 1/07378 324/756.03 |
| 2008/0197866 | A1 * | 8/2008 | Jo | 324/754 |
| 2009/0015275 | A1 * | 1/2009 | Cheng | G01R 1/06744 324/762.01 |
| 2009/0224780 | A1 * | 9/2009 | Chao et al. | 324/754 |
| 2012/0169367 | A1 * | 7/2012 | Kuo | G01R 1/06772 324/756.03 |
| 2012/0306523 | A1 * | 12/2012 | Kwon | G01R 31/2889 324/755.01 |

(Continued)

FOREIGN PATENT DOCUMENTS

| | | |
|---|---|---|
| CN | 102780487 | 11/2012 |
| TW | 200610968 | 4/2006 |

*Primary Examiner* — Tung X Nguyen
*Assistant Examiner* — Neel Shah

(57) ABSTRACT

An apparatus includes a membrane film and a plurality of needle tips with cylinder shapes. The membrane film includes a plurality of signal traces. The needle tips are disposed on the membrane film and are electrically connected to the signal traces. The needle tips are configured to probe a device-under-test (DUT).

18 Claims, 5 Drawing Sheets

(56) References Cited

U.S. PATENT DOCUMENTS

2012/0313659 A1* 12/2012 Hsu .................... G01R 1/07314
324/755.05
2014/0132300 A1* 5/2014 Cros et al. ............... 324/755.05

* cited by examiner

MEMBRANE PROBE CARD

BACKGROUND

In integrated circuit (IC) manufacturing, testing is a key step to ensure the functionality of a device.

Typically, in a testing procedure, an automated test equipment (ATE) is configured to generate testing signals. The ATE is coupled to a wafer prober station. The wafer prober station includes a probe head. The wafer prober station is configured to provide the testing signals for a device-under-test (DUT) via the probe head and a probe card. The probe card includes a plurality of needle tips configured to contact with contact points on the DUT. The needle tips are arranged based on a specific IC design of the DUT. Through the probe card, the automated test system is able to test different DUTs with different designs by using a common, and often quite expensive, probe head.

BRIEF DESCRIPTION OF THE DRAWINGS

The present disclosure can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., are used herein to describe various elements, these elements should not be limited by these terms. These terms are used to distinguish one element from another. For example, a first element could be termed a second element, and, similarly, a second element could be termed a first element, without departing from the scope of the embodiments.

As used herein, the terms "comprising," "including," "having," "containing," "involving," and the like are to be open-ended, i.e., to mean including but not limited to.

In this document, the term "coupled" is termed as "electrically coupled", and the term "connected" is termed as "electrically connected". "coupled" and "connected" are also used to indicate that two or more elements cooperate or interact with each other.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
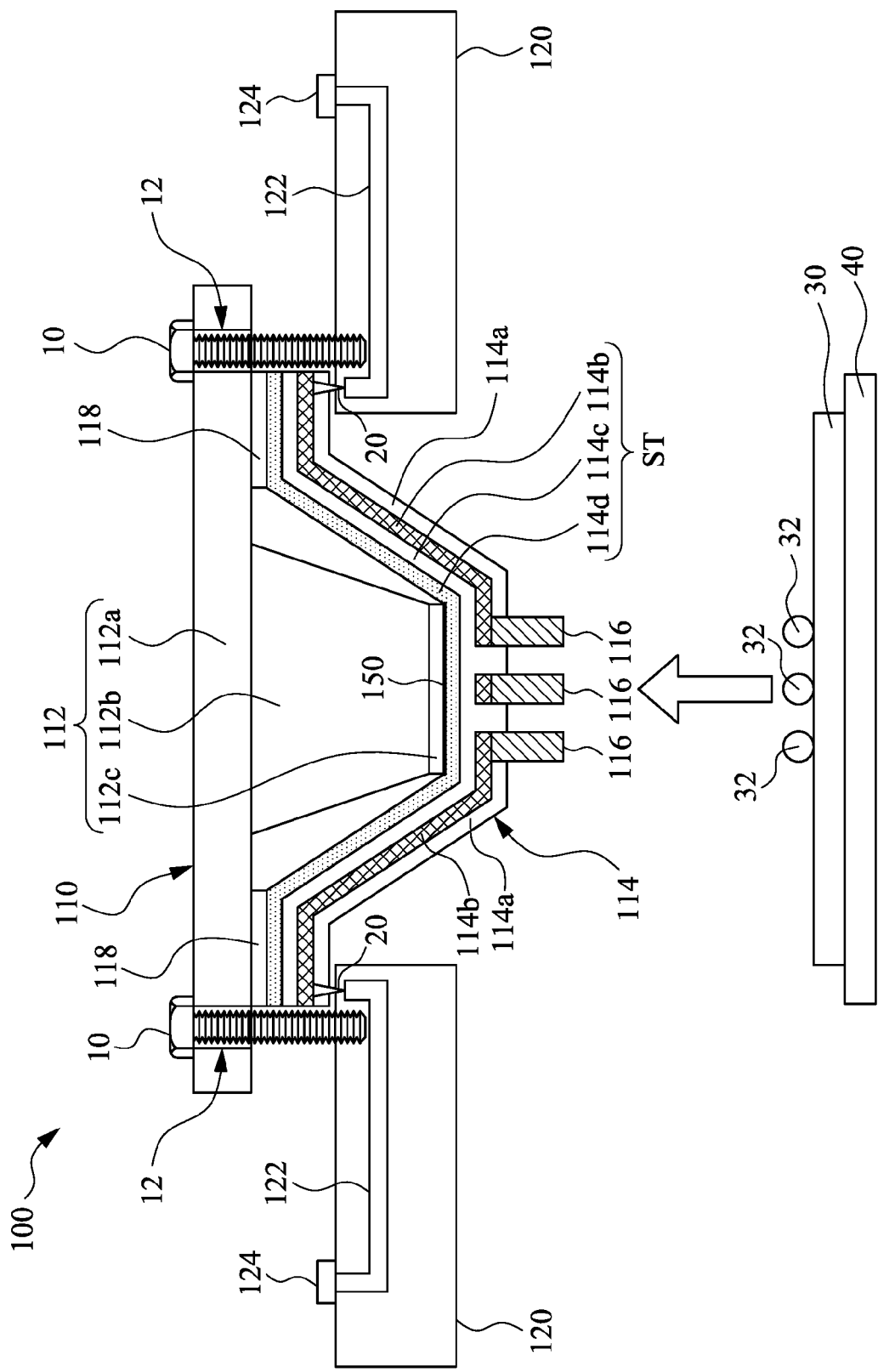
FIG. 1 is a cross-sectional view of a membrane probe card in accordance with various embodiments of the present disclosure.

FIG. 1 is a cross-sectional view of a membrane probe card 100 in accordance with various embodiments of the present disclosure. In these embodiments, the membrane probe card 100 includes a membrane core 110 and a printed circuit board (PCB) 120. The membrane core 110 is attached to the PCB 120. In some embodiments, the membrane core 110 is attached to the PCB 120 through screws 10. In various embodiments, other fasteners, such as clamps, are used.

In some embodiments, the membrane core 110 includes a fixture 112, a membrane film 114, and a plurality of needle tips 116. The fixture 112 includes a metal portion 112a, a plastic portion 112b, and a hard plate 112c. In some embodiments, there are openings 12 on the metal portion 112a, so that the screws 10 fasten the fixture 112 and the PCB 120 through the openings 12. In some embodiment, the hard plate 112c is made by using a ceramic material or a stainless material.

In some embodiments, the membrane film 114 is flexible, and is able to be bent to fit the shape of the fixture 112. In some embodiments, the membrane film 114 is attached to or adhered to the fixture 112. In further embodiment, a portion of the membrane film 114 is adhered to the hard plate 112c of the fixture 112 through an UV adhesive 150. Another portion of the membrane film 114 is attached to or adhered to the metal portion 112a of the fixture 112 through a buffer layer 118. In further embodiments, the buffer layer 118 is an adhesive buffer layer.

The membrane film 114 includes signal traces ST. The signal traces ST are electrically connected to signal channels 122 in the PCB 120 through connectors 20. In some embodiments, the connectors 20 are implemented by golden fingers. The signal channels 122 are configured to be electrically connected to a probe head (not shown) via contacting pads 124, so as to receive testing signals generated by a tester (not shown).

As illustrated in FIG. 1, the needle tips 116 are disposed on the membrane film 114 and are electrically connected to the signal traces ST. In some embodiments, each of the needle tips 116 has a cylinder shape. In some embodiments, first ends of the needle tips 116 physically contact with the signal traces ST, and second ends of the needle tips 116, which are opposite to the first ends, are configured to contact with bumps 32 on a device-under-test (DUT) 30, so as to probe the DUT 30.

For illustration, the DUT 30 is a wafer mounted on a chuck 40. The chuck 40 is configured to lift the DUT 30, such that the bumps 32 on the DUT 30 contact with the needle tips 116. Through such a configuration, the testing signals are able to be provided to the DUT 30 via the signal channels 122, the signal traces ST, and the needle tips 116, so as to test the functionality of the DUT 30.

The needle tips 116 in FIG. 1 are given for illustrative purposes. Various numbers and configurations of the needle tips 116 are within the contemplated scope of the present disclosure.

In some approaches, needle tips of a membrane card are made to have pyramid shapes or cone shapes. However, in such a configuration, when the chuck 40 is over-driven, the needle tips are over inserted into the bumps. As a result, large probe marks on bumps of a DUT are caused, thus resulting in an undesired product.

Compared with the preceding approaches, the needle tips 116 of the membrane probe card 100 in FIG. 1 have cylinder shapes. Therefore, when the needle tips 116 are inserted into the bumps 32, the probe marks on the bumps 32 are identical, such that the failure rate of the DUT 30 is decreased.

In addition, in various embodiments, the buffer layer 118 is fabricated to have a compressive compliance and resilience. When the screws 10 are screwed into the PCB 120, a portion of the buffer layer 118 which is located between the PCB 120 and the metal portion 112a of the fixture 112 is compressed. As a result, a resilience of the compressed portion of the buffer layer 118 forces the connectors 20 to be well connected to the signal channels 122 of the PCB 120.

In some embodiments, the buffer layer 118 with compressive compliance and resilience is fabricated by using silicon rubber. In further embodiments, the thickness of the buffer layer 118 is about 30 mils.

The material and the thickness of the buffer layer 118 are given for illustrative purposes. Other materials and values of thickness are within the contemplated scope of the present disclosure.

In some approaches, buffer layer of a membrane card, which is located between a fixture and a membrane film, is made by using Mylar®. The thickness of such a Mylar®-made buffer layer is about 1 mil. However, such a buffer layer is lack of resilience to protect connectors, which are disposed between connect signal traces of the membrane and signal channels of a PCB, from being broken. For illustration, if screws are fastened into the PCB too much, the connectors are bent or broken. While if the screws are loose, there are loose contacts between the connectors and the signal channels of the PCB.

Compared with the preceding approaches, in the condition of the buffer layer 118, in FIG. 1, being fabricated by using silicon rubber, when the screws 10 fasten into the PCB 120, the buffer layer 118 is compressed, so as to prevent the connector 20 from being bent or broken. Thus, by utilizing the compressive compliance and resilience of buffer layer 118, the screws 10 are able to be tightly fastened into the PCB 120. As a result, compared to the preceding approaches, connections between the signal channels 122 and the signal traces ST are improved.

Figure 2:
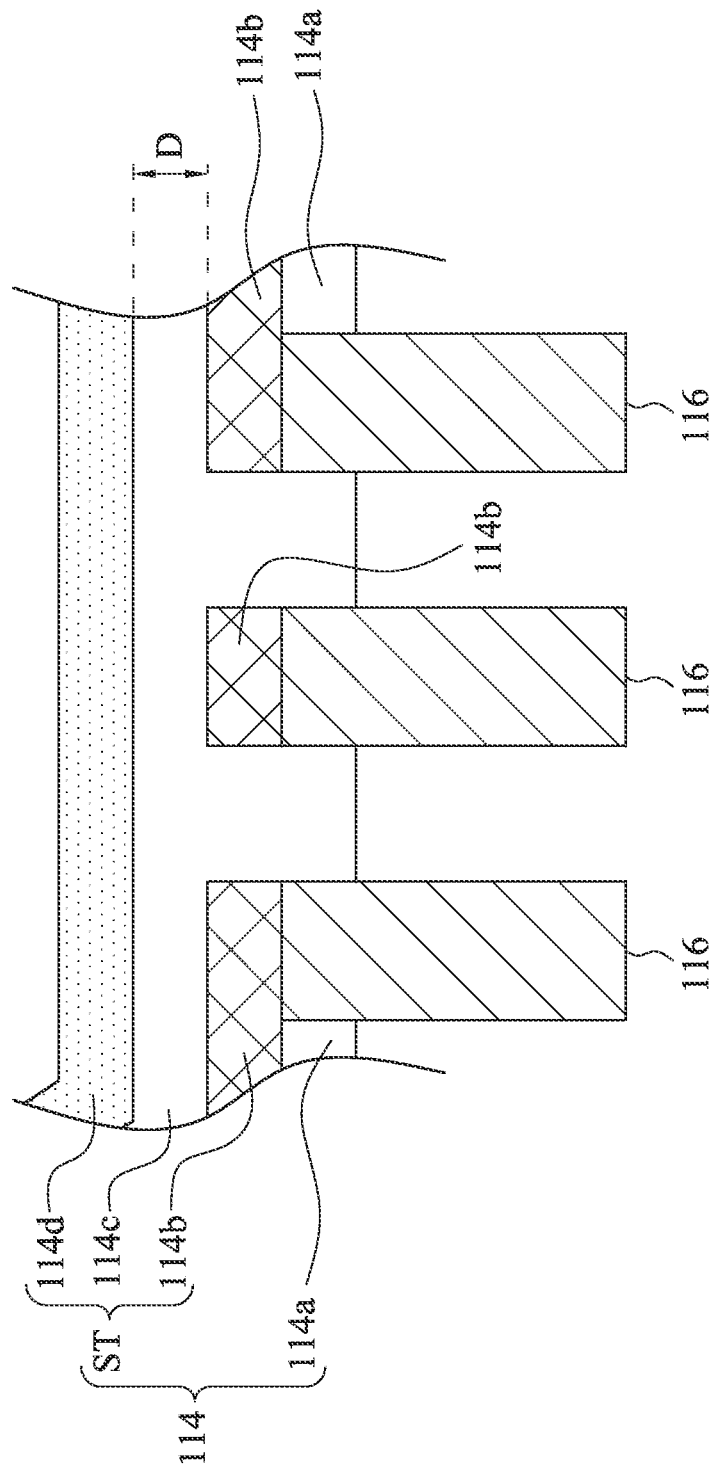
FIG. 2 is a magnified view of a portion of the membrane probe card in FIG. 1 in accordance with various embodiments of the present disclosure.

FIG. 2 is a magnified view of a portion of the membrane probe card 100 in FIG. 1 in accordance with various embodiments of the present disclosure. Referring to both FIG. 1 and FIG. 2, in some embodiments, the membrane film 114 includes a protection layer 114a, conducting layers 114b, a dielectric layer 114c, and a conducting layer 114d. In a top-down perspective, the dielectric layer 114c is formed on the conducting layer 114d, the conducting layers 114b are formed on the dielectric layer 114c, and the protection layer 114a is formed on the conducting layers 114b. In some embodiments, the conducting layers 114b and the conducting layer 114d are fabricated by using metal. The dielectric layer 114c and the protection layers 114a are fabricated by using polymer. The materials mentioned above are given for illustrative purposes. Various materials are within the contemplated scope of the present disclosure.

In some embodiments, each of the signal traces ST includes one of the conducting layers 114b, the dielectric layer 114c, and the conducting layer 114d. In addition, the protection layer 114a is configured to protect the signal traces ST.

Each of the conducting layers 114b is electrically connected to one of the needle tips 116 and one of the connectors 20. In some embodiments, the conducting layers 114b have strip-shapes. One end of one of the conducting layers 114b contacts with one of the needle tips 116, and one opposite end of the conducting layers 114b contacts with one of the connectors 20. In some embodiments, lengthwise directions of the needle tips 116 are perpendicular to the conducting layers 114b.

In some embodiments, the conducting layer 114d is electrically connected to a common ground of the membrane probe card 100. In further embodiments, the conducting layer 114d is electrically connected to the common ground by contacting with the metal portion 112a of the fixture 112, for example, via a through hole (not shown).

In some embodiments, the conducting layers 114b are parallel to the conducting layer 114d. A portion of the dielectric layer 114c is interposed between the first conducting layers 114b and the second conducting layer 114d. The thickness of the portion of the dielectric layer 114c between the conducting layers 114b and the conducting layer 114d (shown as intervals D) is able to be varied to adjust impedances of the signal traces ST. In some embodiments, the impedances of the signal traces ST are about 50 ohms for impedance matching.

Figure 3:
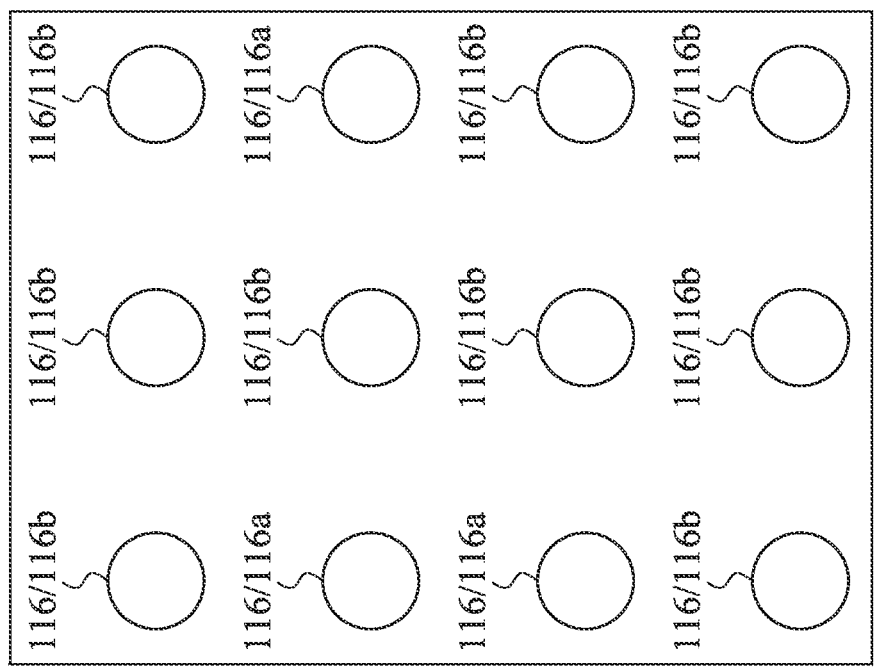
FIG. 3 is a bottom view of a portion of the membrane probe card in FIG. 1 in accordance with various embodiments of the present disclosure.

FIG. 3 is a bottom view of a portion of the membrane probe card 100 in FIG. 1 in accordance with various embodiments of the present disclosure. In these embodiments, the needle tips 116 including voltage controlled oscillator inductor (VCO-inductor) tips 116a and non-VCO-inductor tips 116b. The VCO-inductor tips 116a are configured to probe VCO-inductors in the DUT 30. The non-VCO-inductor tips 116b are configured to probe other components in the DUT 30.

The arrangement and the quantities of the VCO-inductor tips 116a and the non-VCO-inductor tips 116b are based on the actual design of the DUT 30. The arrangement and the quantities shown in FIG. 3 are given for illustrative purposes. Various arrangements and quantities are within the contemplated scope of the present disclosure.

Following to Leeson's equation, the higher the quality-factors of the VCO-inductor tips 116a are, the lower the phase noise in probing the VCO-inductors is. Thus, in some embodiments, to decrease the phase noise in probing the VCO-inductors, the VCO-inductor tips 116a are fabricated to have high quality-factors.

Figure 4:
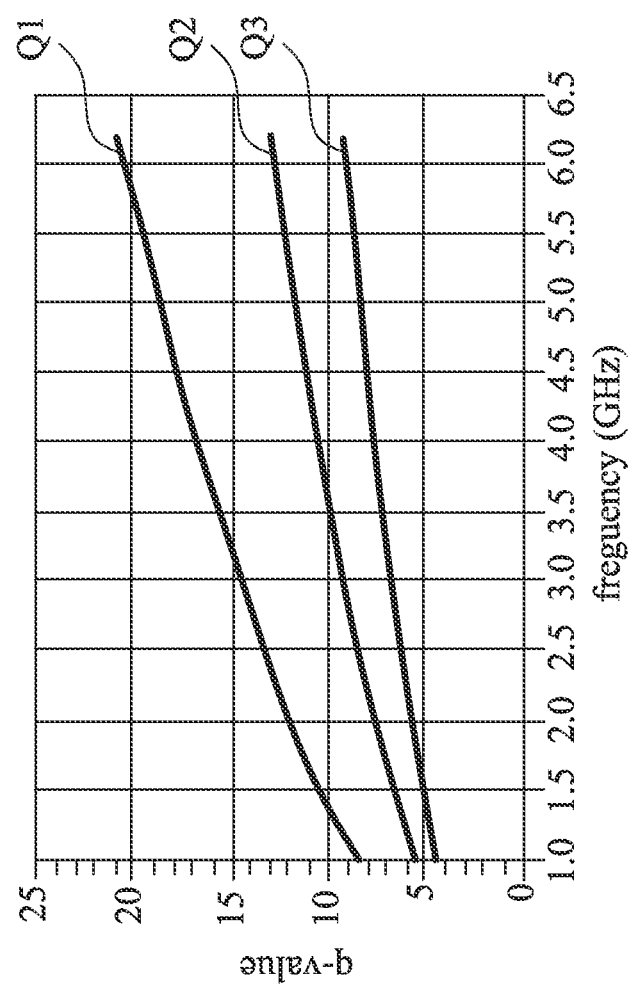
FIG. 4 illustrates quality-factors of various kinds of needle tips in accordance with various embodiments.

Referring to FIG. 4, curve Q1 represents quality-factors of a needle tip which is fabricated by using copper and having a length of 40 micrometers under a frequency band from substantially 1 gigahertz to 6 gigahertzs, curve Q2 represents quality-factors of a needle tip which is fabricated by using nickel and having a length of 40 micrometers under the frequency band from substantially 1 gigahertz to 6 gigahertzs, and curve Q3 represents quality-factors of a needle tip which is fabricated by using nickel and having a length of 20 micrometers under the frequency band from substantially 1 gigahertz to 6 gigahertzs. As shown in FIG.

4, the needle tip fabricated by using copper has higher quality-factors than the needle tip fabricated by using nickel has under the frequency band from 1 gigahertz to 6 gigahertzs. A frequency of a common used VCO is about 2.4 gigahertzs. Thus, in some embodiments, the VCO-inductor tips 116a are fabricated by using copper so as to decrease the phase noise in probing the VCO-inductors.

However, because that the copper is soft, the copper-made needle tips are bent easily. Thus, in some embodiments, when the VCO-inductor tips 116a are fabricated by using copper, the non-VCO-inductor tips 116b are fabricated by using other materials with higher degree of hardness to support the copper-made needle tips. In some embodiments, non-VCO-inductor tips 116b are fabricated by using nickel.

The materials used to fabricate the VCO-inductor tips 116a and non-VCO-inductor tips 116b in the preceding embodiments are given for illustrative purposes. Other materials are within the contemplated scope of the present disclosure.

Figure 5:
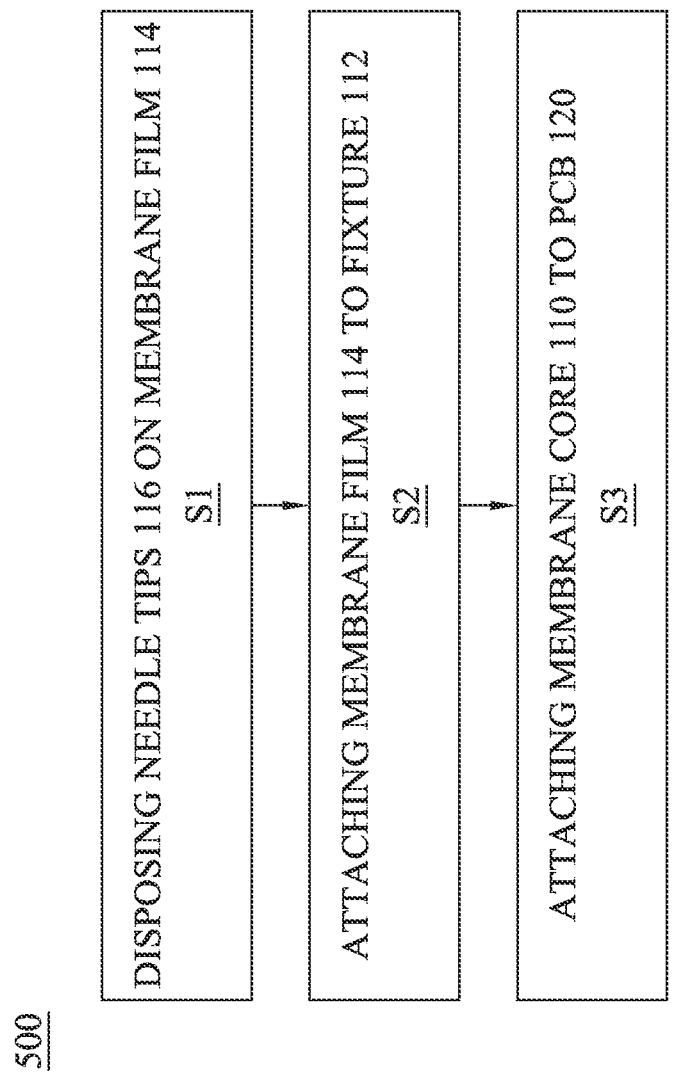
FIG. 5 is a flow chart of a manufacturing method of the membrane probe card in FIG. 1 in accordance with various embodiments of the present disclosure.

FIG. 5 is a flow chart of a manufacturing method 500 of the membrane probe card 100 in FIG. 1 in accordance with various embodiments of the present disclosure.

In operation S1, the needle tips 116 are disposed on the membrane film 114. The arrangement of the VCO-inductor tips 116a and the non-VCO-inductor tips 116b are based on the actual design of the DUT 30. In some embodiments, the VCO-inductor tips 116a are fabricated by using a material with high quality-factors. In further embodiments, the VCO-inductor tips 116a are made of copper. In some embodiments, the non-VCO-inductor tips 116b are fabricated by using a material with high degree of hardness. In further embodiments, the non-VCO-inductor tips 116b are made of nickel. In addition, in some embodiments, all of the needle tips 116 are manufactured to have cylinder shapes, and have identical lengths and diameters.

In operation S2, the membrane film 114 is attached (or adhered) to the fixture 112 through the buffer layer 118. In some embodiments, the buffer layer 118 is fabricated by using silicon rubber, and the thickness of the buffer layer 118 is about 30 mils, such that the buffer layer 118 has a compressive compliance and resilience.

In operation S3, the membrane core 110 is attached to the PCB 120. In some embodiments, the membrane core 110 is attached to the PCB 120 by using screws 10. The screws 10 are screwed into the PCB 120 via the openings 12 on the metal portion 112a of the fixture 112. In some embodiments, the screws 10 are fastened into the PCB 120 strictly, such that a portion of the buffer layer 118 located between the metal portion 112a of the fixture 112 and the PCB 120 is compressed. Through the resilience, the compressed portion of the buffer layer 118 forces the connector 20 to well contact with the signal channels 122 of the PCB 120.

The above illustrations include exemplary operations, but the operations are not necessarily performed in the order shown. Operations are able to be added, replaced, changed order, and/or eliminated as appropriate, in accordance with the spirit and scope of various embodiments of the present disclosure.

In addition, the details of the manufacturing method 500 are able to be ascertained by referring to the paragraphs described above, thus a description in this regard will not be repeated.

In some embodiments, an apparatus is disclosed that includes a membrane film and a plurality of needle tips with cylinder shapes. The membrane film includes a plurality of signal traces. The needle tips are disposed on the membrane film and are electrically connected to the signal traces. The needle tips are configured to probe a DUT.

Also disclosed is an apparatus that includes a PCB and a membrane core. The PCB includes a plurality of signal channels. The membrane core includes a fixture, a membrane film, and a plurality of needle tips with cylinder shapes. The fixture is attached to the PCB. The membrane film is attached to the fixture. The membrane film includes a plurality of signal traces. The signal traces are electrically connected to the signal channels of the PCB through a plurality of connectors respectively. The signal traces are configured to receive testing signals from the signal channels. The needle tips are disposed on the membrane core and are electrically connected to the signal traces of the membrane film. The needle tips are configured to receive the testing signals and provide the testing signals to a DUT.

Also disclosed is a method that includes the operations below. A plurality of needle tips with cylinder shapes are provided on a membrane film including a plurality of signal traces. The needle tips with cylinder shapes are electrically connected to the signal traces.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. An apparatus comprising:
   a fixture, wherein the fixture comprises a metal portion, a plastic portion, and a hard plate, and the plastic portion is disposed between the metal portion and the hard plate, wherein the metal portion of the fixture comprises at least one opening;
   a membrane film comprising a plurality of signal traces;
   a plurality of needle tips disposed on the membrane film and electrically connected to the signal traces, wherein the needle tips are configured to probe a device-under-test (DUT), the needle tips are wholly cylindrical, and at least one portion of the membrane film is attached to the fixture through a buffer layer that has a compressive compliance and resilience; and
   a printed circuit board, wherein the fixture and the printed circuit board are fastened by at least one screw passing through the at least one opening of the metal portion of the fixture.

2. The apparatus as claimed in claim 1, wherein the buffer layer is made by using silicon rubber.

3. The apparatus as claimed in claim 1 further comprising a printed circuit board (PCB), wherein the fixture is attached to the PCB, and the needle tips are electrically connected to the PCB via the signal traces.

4. The apparatus as claimed in claim 1, wherein the needle tips comprise a first-type tip and a second-type tip, and quality-factors of the first-type tip and the second-type tip are different.

5. The apparatus as claimed in claim 4, wherein the first-type tip is fabricated by using copper, and the second-type tip is fabricated by using nickel.

6. The apparatus as claimed in claim 1, wherein at least one of the needle tips is fabricated by using copper.

7. The apparatus as claimed in claim 1, wherein at least one portion of the membrane film is attached to the metal portion through the buffer layer.

8. The apparatus as claimed in claim 1, wherein at least one portion of the membrane film is adhered to the hard plate of the fixture through a UV adhesive.

9. An apparatus comprising:
a printed circuit board (PCB) comprising a plurality of signal channels;
a membrane core comprising:
a buffer layer has a compressive compliance and resilience;
a fixture attached to the PCB, wherein the fixture comprises a metal portion, a plastic portion, and a hard plate, and the plastic portion is disposed between the metal portion and the hard plate, wherein the metal portion of the fixture comprises at least one opening, and the fixture and the printed circuit board are fastened by at least one screw passing through the at least one opening of the metal portion of the fixture;
a membrane film attached to the fixture through the buffer layer, wherein the membrane film comprises a plurality of signal traces, the signal traces are electrically connected to the signal channels of the PCB through a plurality of connectors respectively, and the signal traces are configured to receive testing signals from the signal channels; and
a plurality of needle tips disposed on the membrane core and electrically connected to the signal traces of the membrane film, wherein the needle tips are configured to receive the testing signals and provide the testing signals to a device-under-test (DUT), and the needle tips are wholly cylindrical.

10. The apparatus as claimed in claim 9, wherein the buffer layer is fabricated by using silicon rubber.

11. The apparatus as claimed in claim 9, wherein the buffer layer has a compressive compliance.

12. The apparatus as claimed in claim 9, wherein the needle tips comprise:
a voltage controlled oscillator (VCO) inductor tip having a first quality-factor; and
a non-VCO-inductor tip having a second quality-factor;
wherein the first quality-factor is larger than the second quality-factor.

13. The apparatus as claimed in claim 12, wherein the VCO-inductor tip and the non-VCO-inductor tip are made by using different materials.

14. The apparatus as claimed in claim 13, wherein the VCO-inductor tip is made by using copper and the non-VCO-inductor tip is made by using nickel.

15. A method comprising:
disposing a plurality of needle tips on a membrane film comprising a plurality of signal traces, wherein the plurality of needle tips with cylinder shapes are electrically connected to the signal traces, and the needle tips are wholly cylindrical;
attaching at least one portion of the membrane film to a fixture through a buffer layer that has a compressive compliance and resilience, wherein the fixture comprises a metal portion, a plastic portion, and a hard plate, and the plastic portion is disposed between the metal portion and the hard plate, wherein the metal portion of the fixture comprises at least one opening; and
fastening the fixture and a printed circuit board by at least one screw passing through the at least one opening of the metal portion of the fixture.

16. The method as claimed in claim 15, further comprising:
fabricating the buffer layer by using silicon rubber.

17. The method as claimed in claim 15, wherein disposing the needle tips with cylinder shapes on the membrane film comprises:
disposing a VCO-inductor tip having a first quality-factor on the membrane film; and
disposing a non-VCO-inductor tip having a second quality-factor on the membrane film;
wherein the first quality-factor is larger than the second quality-factor.

18. The method as claimed in claim 17, further comprising:
fabricating the VCO-inductor tip by using copper; and
fabricating the non-VCO-inductor tip by using nickel.

* * * * *